(12) United States Patent
Kim et al.

(10) Patent No.: US 7,586,124 B2
(45) Date of Patent: Sep. 8, 2009

(54) ORGANIC ELECTROLUMINESCENT DEVICE AND METHOD FOR MANUFACTURING THE SAME

(75) Inventors: Chang Nam Kim, Seoul (KR); Ho Nyun Lee, Gyeonggi-do (KR); Jin Won Chung, Seoul (KR); Sun Kil Kang, Gyeonggi-do (KR); Do Youl Kim, Seoul (KR); Hong Gyu Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 430 days.

(21) Appl. No.: 11/434,820

(22) Filed: May 17, 2006

(65) Prior Publication Data

US 2006/0262052 A1 Nov. 23, 2006

(30) Foreign Application Priority Data

May 17, 2005 (KR) .................. 10-2005-0041203

(51) Int. Cl.
*H01L 33/00* (2006.01)
(52) U.S. Cl. .................. 257/72; 257/83; 257/E33.064
(58) Field of Classification Search .................. 257/72, 257/83, E33.064; 313/500, 505, 506
See application file for complete search history.

(56) References Cited

U.S. PATENT DOCUMENTS

2005/0001546 A1 1/2005 Yamaguchi .................. 313/512
2005/0007015 A1* 1/2005 Yokoyama et al. .......... 313/506

FOREIGN PATENT DOCUMENTS

| CN | 1575057 A | 2/2005 |
|---|---|---|
| EP | 0 732 868 A1 | 9/1996 |
| EP | 1 482 572 A1 | 12/2004 |
| JP | 2002-318556 | 10/2002 |
| WO | WO 2004/026002 A1 | 3/2004 |

OTHER PUBLICATIONS

European Search Report dated Aug. 22, 2006.

* cited by examiner

*Primary Examiner*—Minh-Loan T Tran
(74) *Attorney, Agent, or Firm*—Holland & Knight LLP

(57) ABSTRACT

An organic electroluminescent device, adapted to enhance device reliability while allowing simplification of a manufacturing process, and a method for manufacturing the same are disclosed. The organic electroluminescent (EL) device, comprising a substrate, TFTs located in respective unit pixel regions on the substrate, a first insulation layer to insulate the TFTs, first electrodes formed on the first insulation layer while contacting the TFTs, respectively, a partition wall positioned between the unit pixel regions on the first insulation layer, a subsidiary electrode formed on the partition wall, an organic light emitting layer positioned on the first electrodes, an insulation part to insulate each first electrode from an associated subsidiary electrode, and a second electrode positioned on the organic light emitting layer and connected with the subsidiary electrode.

15 Claims, 23 Drawing Sheets

ORGANIC ELECTROLUMINESCENT DEVICE AND METHOD FOR MANUFACTURING THE SAME

This application claims the benefit of Korean Patent Application No. P2005-0041203, filed on May 17, 2005, which is hereby incorporated by reference as if fully set forth herein.

BACKGROUND OF THE INVENTION

1. Field of the Invention

The present invention relates to a flat panel display device, and more particular to, an organic electroluminescent device, which can enhance device reliability while allowing simplification of a manufacturing process, and a method for manufacturing the same.

2. Discussion of the Related Art

In recent years, there is an increasing demand for providing flat panel display devices occupying a small space according to an increase in size of a display device. As one of such flat panel display devices, an organic electroluminescent device also referred to as an organic light emitting diode (OLED) has been rapidly advanced in its manufacturing technique, and widened in application thereof.

The organic electroluminescent device is a device that comprises a first electrode as an electron injection electrode (cathode), a second electrode as a hole injection electrode (anode) and an organic light emitting layer formed between the first and second electrodes in which electrons and holes injected through the first and second electrodes are recombined to form pairs of exitons, so that the pairs of exitons release light when they are extinguished as a result of energy transition from an exited state to a ground state.

Since the organic electroluminescent device has a merit in terms of its driving voltage of 5~10 V which is lower than that of a plasma display panel (PDP) or an inorganic electroluminescent display device, it has been actively investigated.

In addition, since the organic electroluminescent device has excellent characteristics such as wide viewing angle, high response speed, high contrast and the like, it can be applied to pixels of a graphic display, and pixels of a TV screen or a surface light source. In addition, the organic electroluminescent device can be formed on a flexible transparent substrate like a plastic substrate, and formed in a very compact and light structure. Furthermore, since the organic electroluminescent device exhibits good color reproduction, it is appropriate for a next generation flat panel display.

Furthermore, since the organic electroluminescent device does not require a backlight member generally used in a well-known liquid crystal display (LCD), it has low power consumption, and provides excellent color sensation.

Generally, the organic electroluminescent device is generally classified into a passive matrix type and an active matrix type according to its structure and driving method.

Unlike the passive matrix type, in the case where the active matrix type is adapted to emit light through a glass surface of a substrate (typically, known as a bottom emission manner), an increase in the size or the number of thin film transistors (TFT) causes a rapid reduction in aperture ratio, thereby making it difficult to use the organic electroluminescent device as the display device.

In order to solve the problem, a top emission manner has been suggested, in which light is emitted through a side opposite to the glass surface so as to allow the aperture ratio to be independent of the size or the number of TFTs.

The top emission type organic electroluminescent device comprises a reflection layer, an organic light emitting layer, and a transparent electrode layer sequentially formed in this order on a substrate having TFTs and a storage capacitor formed therein, such that, when light is emitted from the organic light emitting layer, it is reflected by the reflection layer, and then emitted to an outside through an opposite side of the substrate. As a result, the organic electroluminescent device of this type is prevented from having its aperture ratio lowered due to the TFTs.

A conventional method for manufacturing a top emission type active matrix organic EL device will be described with reference to the drawings.

FIGS. 1A to 1F are cross-sectional views illustrating manufacturing steps of the conventional top emission type active matrix organic EL device.

At first, referring to FIG. 1A, a thin film transistor (TFT) 12 is formed in pixel unit on a transparent substrate 11.

Specifically, after forming an amorphous silicon layer on the transparent substrate 11, laser is illuminated on the surface of the amorphous silicon layer to form a poly-silicon layer through melting and recrystallization of the amorphous silicon layer. Then, the poly-silicon layer is patterned to form an island shape via a photolithography and etching process to form a semiconductor layer 12a.

Next, a gate insulation layer 12b is formed on the overall surface including the semiconductor layer 12a, and a metallic layer comprising, for example, chrome (Cr) is formed thereon, followed by forming a gate electrode 12c at a location corresponding to a central portion of the semiconductor layer 12a on the gate insulation layer 12b via the photolithography and etching process.

Then, p-type or n-type impurities are implanted into the semiconductor layer 12a using the gate electrode 12c as a mask, after which heating is performed for the purpose of activating the implanted impurities, thereby forming a source electrode 12d and a drain electrode 12e in the semiconductor layer 12a. As a result, each of the TFTs 12 is completely formed.

After a first insulation layer 13 is formed on the overall surface including the TFTs 12, a contact 14 is formed so as to be connected with the source electrode 12d and the drain electrode 12e of each TFT 12 through the first insulation layer 13 and the gate insulation layer 12b, and a second insulation layer 15 is formed on the overall surface thereof.

Then, a flattening insulation layer 16 is formed on the second insulation layer 15 as shown in FIG. 1B, and selectively removed along with the second insulation layer 15 so as to expose the surface of the contact 14 connected with the drain electrode 12e via the photolithography and etching process, thereby forming a first contact hole 17.

Then, an anode electrode material 18 is deposited on the flattening insulation layer 16 and into the first contact hole 17 such that the first contact hole 17 is filled with the anode electrode material, as shown in FIG. 1C.

Next, as shown in FIG. 1D, an anode electrode 18a is divided in pixel unit by selectively removing the anode electrode material 18 via the photolithography and etching process, and then an insulation layer 21 is formed on a portion excluding a light emitting part.

Next, an organic EL layer 22 is formed on the overall surface, as shown in FIG. 1E, and a cathode electrode 23 is formed on the organic EL layer 22, as shown in FIG. 1F.

As a result, the conventional top emission type active matrix organic EL device is completed.

Meanwhile, adhesion between the anode electrodes 18a and the flattening insulation layer 16 is low. Accordingly, when removing the photoresist film used for the photolithography and etching process for dividing the anode electrodes, there is high possibility that the anode electrodes 18a are also separated from the flattening insulation layer 16.

The problems of the prior art described above will be set forth in detail with reference to the drawings hereinafter.

FIGS. 2A to 2D illustrate the problems which can arise when manufacturing the conventional organic EL device.

As shown in FIG. 1C described above, after depositing the anode electrode material 18, the photolithography and etching process is performed to allow the anode electrodes to be divided from each other in pixel units.

Specifically, as shown in FIG. 2A, after a photo-resist 19 is applied to the anode electrode material 18, a mask 20 having patterns to expose edges of each pixel is aligned on the transparent substrate 11, and the photo-resist 19 is exposed to light by illuminating the light towards the transparent substrate 11 from above the mask 20.

Then, the exposed portions of the photo-resist 19 are removed by stripping off the mask 20 and developing the photo-resist 19, as shown in FIG. 2B.

Next, as shown in FIG. 2C, after forming the anode electrodes 18a in pixel units by removing the anode electrode material 18 using the photo-resist 19 as a mask, the transparent substrate 11 is input to a stripper to remove the photo-resist 19, as shown in FIG. 2D.

At this time, separation of the anode electrodes 18a from the flattening insulation layer 16 occurs due to low adhesion between the anode electrodes 18a and the flattening insulation layer 16. As a result, device reliability is significantly deteriorated.

SUMMARY OF THE INVENTION

Accordingly, the present invention is directed to an organic electroluminescent device, and a method for manufacturing the same that substantially obviate one or more problems due to limitations and disadvantages of the related art.

An object of the present invention is to provide an organic EL device, which can prevent anode electrodes from being peeling off, and a method for manufacturing the same.

It is another object of the present invention to provide the organic EL device, which solves the problem of resistance increase of a transparent cathode electrode in the top emission type device, thereby enhancing efficiency and reliability of the device, and the method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an organic electroluminescent device, comprising: a substrate; TFTs located in respective unit pixel regions on the substrate; a first insulation layer on the TFTs to insulate the TFTs; first electrodes formed on the first insulation layer while contacting the TFTs, respectively; a partition wall positioned between the respective unit pixel regions on the first insulation layer; a subsidiary electrode formed on the partition wall; an organic light emitting layer positioned on the first electrodes; an insulation part to insulate each of the first electrodes from an associated subsidiary electrode; and a second electrode positioned on the organic light emitting layer and connected with the subsidiary electrode.

In accordance with another aspect of the present invention, there is provided a method for manufacturing the organic electroluminescent device, comprising the steps of: forming a first insulation layer on a substrate having TFTs formed thereon; forming a contact connected with a source electrode and a drain electrode of each TFT through the first insulation layer; forming a second insulation layer on the first insulation layer and the contact; forming a first contact hole on the second insulation layer so as to expose the surface of the contact connected with the drain electrode; forming a partition wall at a portion separating respective unit pixel regions on the second insulation layer; depositing a first electrode material on the second insulation layer and the partition wall; forming an insulation part at a side of the partition wall; forming a second contact hole in the insulation part so as to expose a subsidiary electrode formed on the partition wall; forming an organic light emitting layer on each unit pixel region; and depositing a second electrode on an overall surface including the organic light emitting layer and the second contact hole.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 3A to 3E are plan views illustrating manufacturing steps of an organic EL device according to one embodiment of the present invention, and FIGS. 4A to 4E are cross-sectional views taken along line A-A shown in FIGS. 3A to 3E, respectively.

Figure 1A:
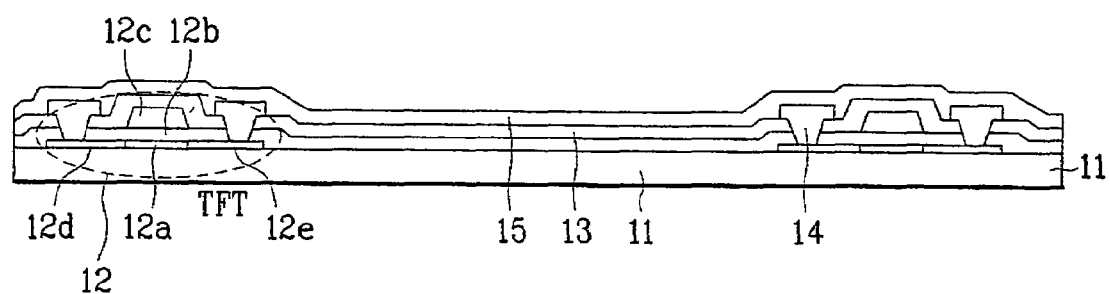
FIGS. 1a to 1f are cross-sectional views illustrating manufacturing steps of a conventional organic EL device.
Figure 1B:
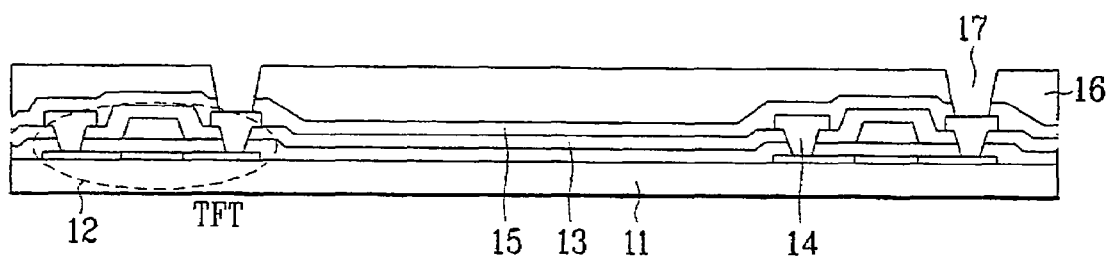
Figure 1C:
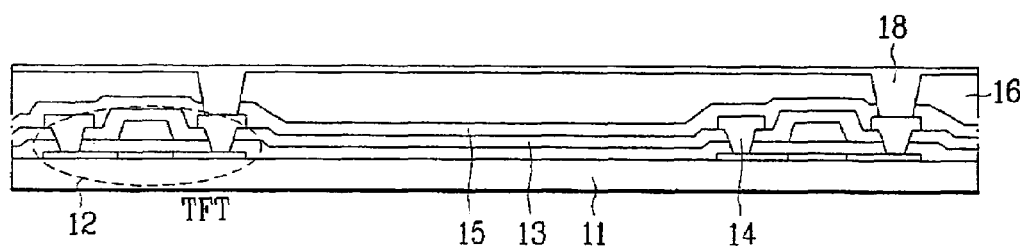
Figure 1D:
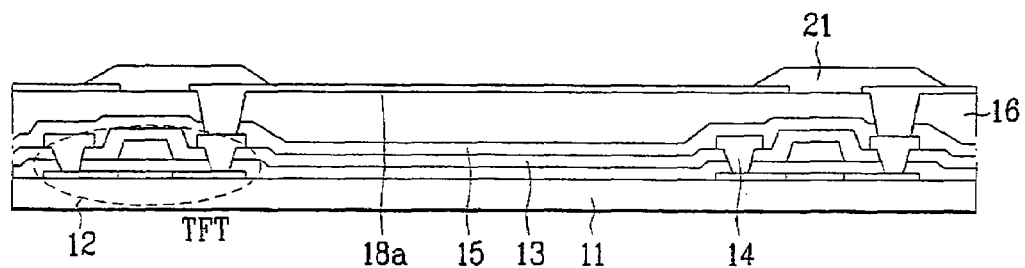
Figure 1E:
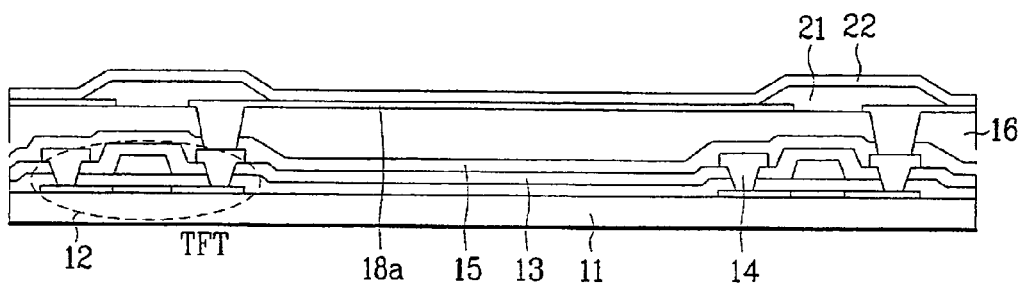
Figure 1F:
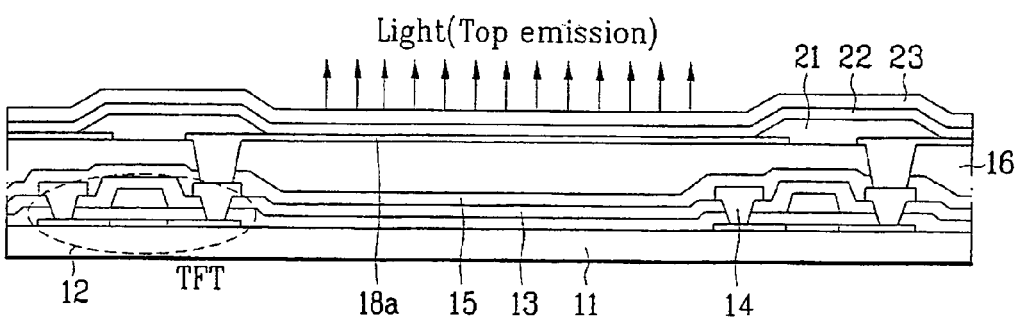
Figure 2A:
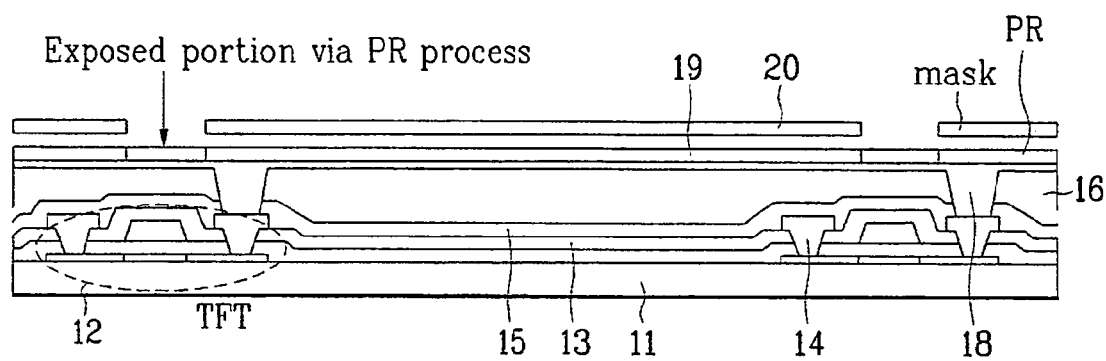
FIGS. 2A to 2D illustrate the problems which can arise when manufacturing the conventional organic EL device.
Figure 2B:
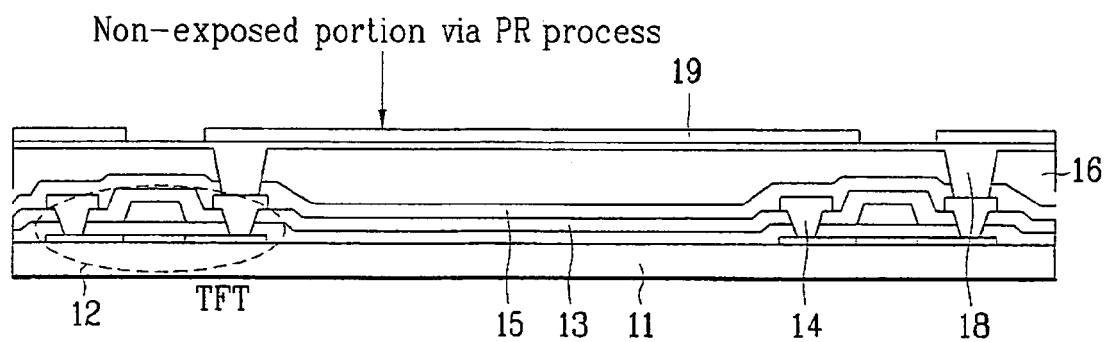
Figure 2C:
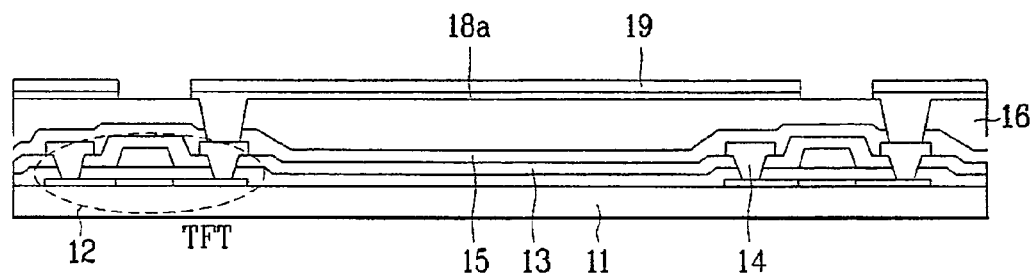
Figure 2D:
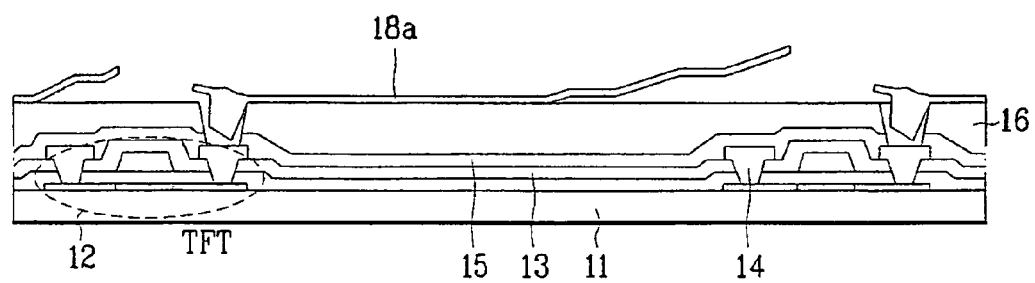
Figure 3A:
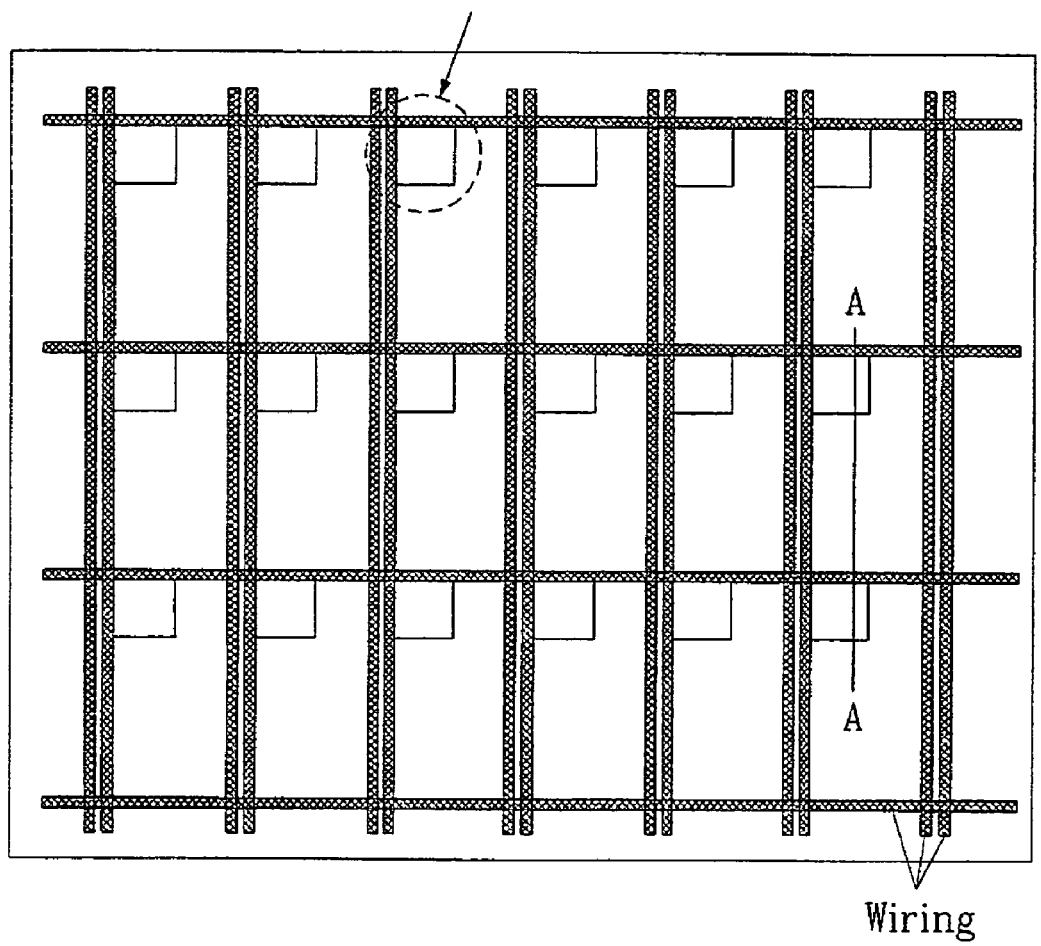
FIGS. 3A to 3E are plan views illustrating manufacturing steps of an organic EL device in accordance with one embodiment of the present invention.
Figure 4A:
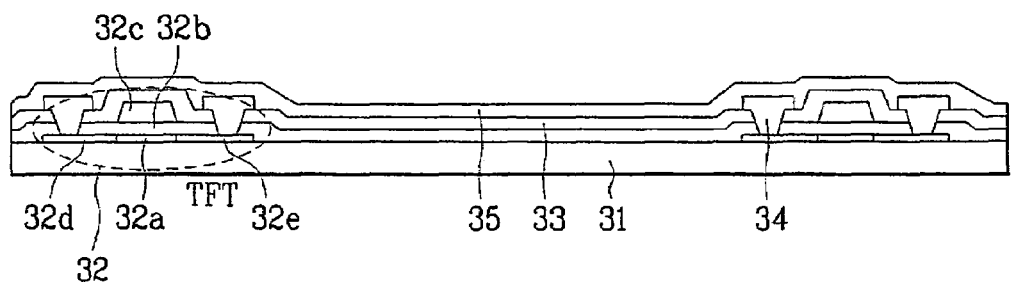
FIGS. 4A to 4E are cross-sectional views taken along line A-A shown in FIGS. 3A to 3E.

In a method for manufacturing the organic EL device according to the present invention, a thin film transistor (TFT) 32 is formed in pixel unit on a transparent substrate 31, as shown in FIGS. 3A and 4A.

Specifically, after forming an amorphous silicon layer on the transparent substrate 31, laser is illuminated on the surface of the amorphous silicon layer to form a poly-silicon layer through melting and recrystallization of the amorphous silicon layer. Then, the poly-silicon layer is patterned to form an island shape via a photolithography and etching process to form a semiconductor layer 32a.

Next, a gate insulation layer 32b is formed on the overall surface including the semiconductor layer 32a, and a metallic layer comprising, for example, chrome (Cr) is formed thereon and patterned to form a gate electrode 32c at a location corresponding to a central portion of the semiconductor layer 32a on the gate insulation layer 32b via the photolithography and etching process.

Then, p-type or n-type impurities are implanted to the semiconductor layer 32a using the gate electrode 32c as a mask, after which heating is performed for the purpose of activating the implanted impurities, thereby forming a source electrode 32d and a drain electrode 32e on the semiconductor layer 32a. As a result, each of the TFTs 32 is formed.

After a first insulation layer 33 is formed on the overall surface including the TFTs 32, a contact 34 is formed so as to be connected with the source electrode 32d and the drain electrode 32e of each TFT 32 through the first insulation layer 33 and the gate insulation layer 32b, and a second insulation layer 35 is formed on the overall surface thereof.

Figure 3B:
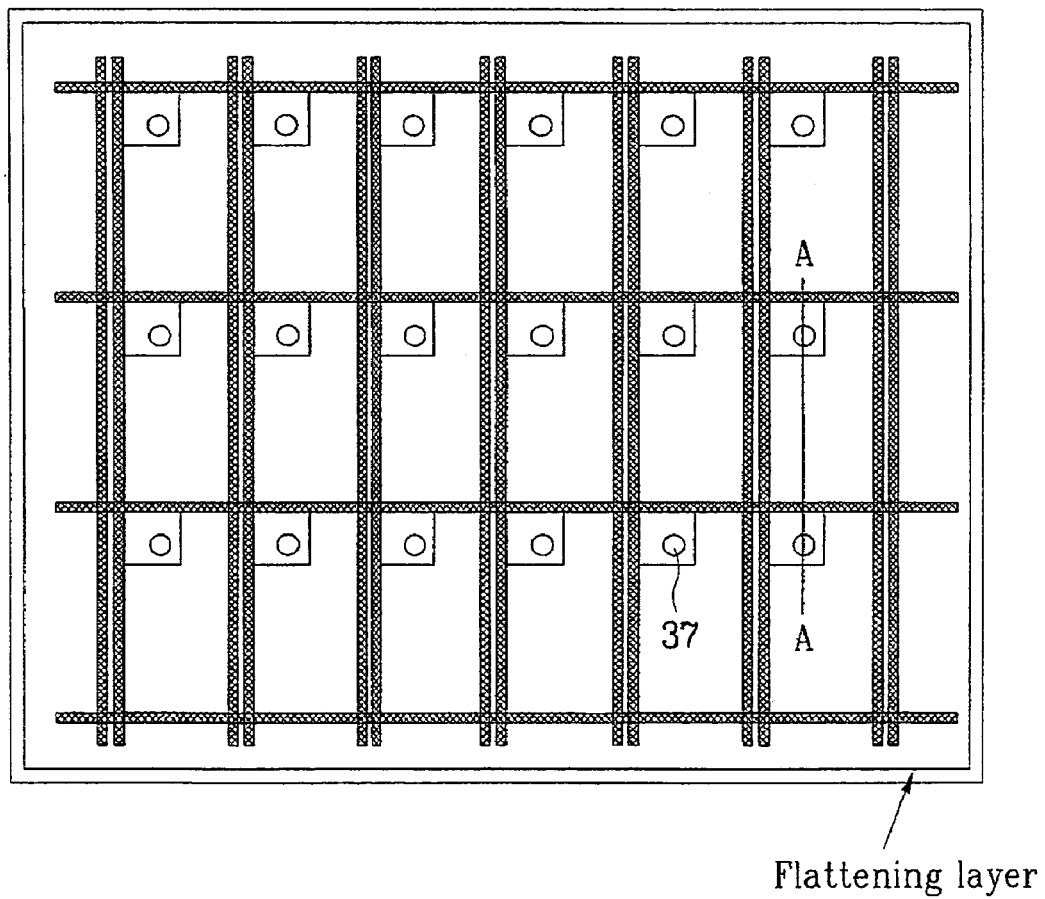
Figure 4B:
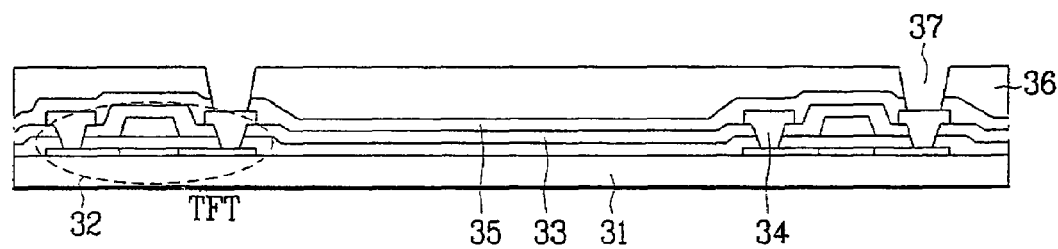

Then, as shown in FIGS. 3B and 4B, a flattening insulation layer 36 is formed on the second insulation layer 35, and selectively removed along with the second insulation layer 35 so as to expose the surface of the contact 14 connected with the drain electrode 32e, thereby forming a first contact hole 37.

Figure 3C:
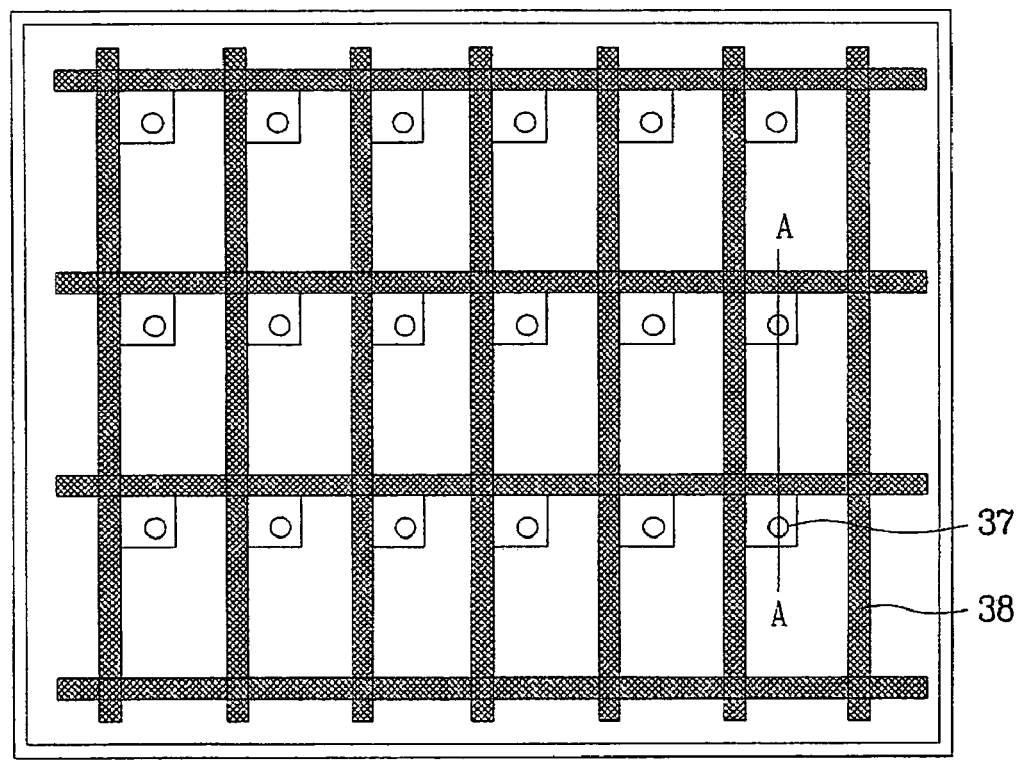
Figure 4C:
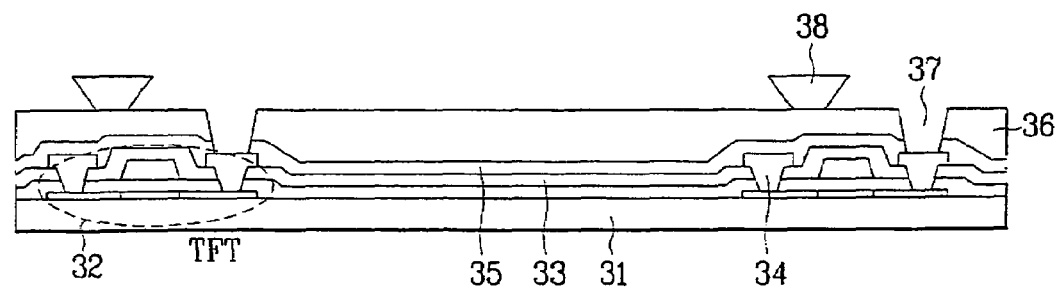

Then, as shown in FIGS. 3C and 4C, a partition wall 38 is formed at a portion (boundary between unit pixel regions) designed to divide anode electrodes (first electrodes) from each other.

At this time, the partition wall 38 is formed to an overhang structure wherein an upper portion of the partition wall is wider than a lower portion.

Figure 5A:
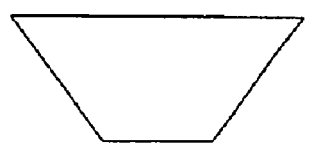
FIGS. 5A to 5E are views illustrating examples of a partition wall in accordance with the present invention.
Figure 5B:
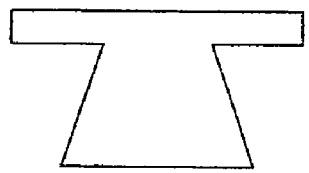
Figure 5C:
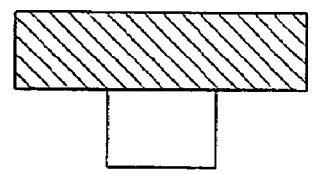
Figure 5D:
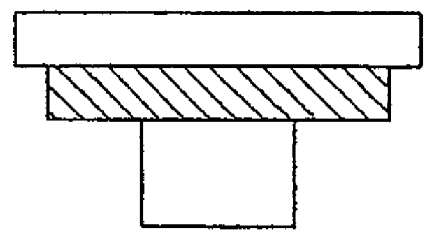
Figure 5E:
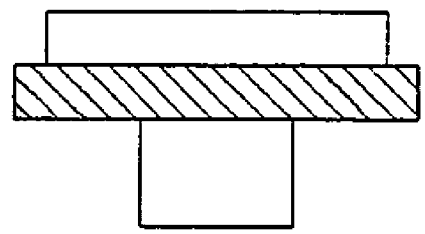

For example, the partition wall 38 may have an inversed trapezoidal-shape as shown in FIG. 5A or an eave shape as shown in FIGS. 5B and 5C. Alternatively, the partition wall may have a multiple-layer shape as shown in FIGS. 5D and 5E, and be made of organic material, inorganic material, metal or a combination thereof.

At this time, when manufacturing the device by forming the anode electrodes directly on the second insulation layer 35 which is used to manufacture the TFT substrate without using a flattening insulation layer 36, the step shown in FIGS. 3B and 4B is omitted.

In other words, the partition wall 38 is formed directly on the flattening insulation layer 36.

Herein, the structure having the flattening insulation layer 36 will be described.

Figure 3D:
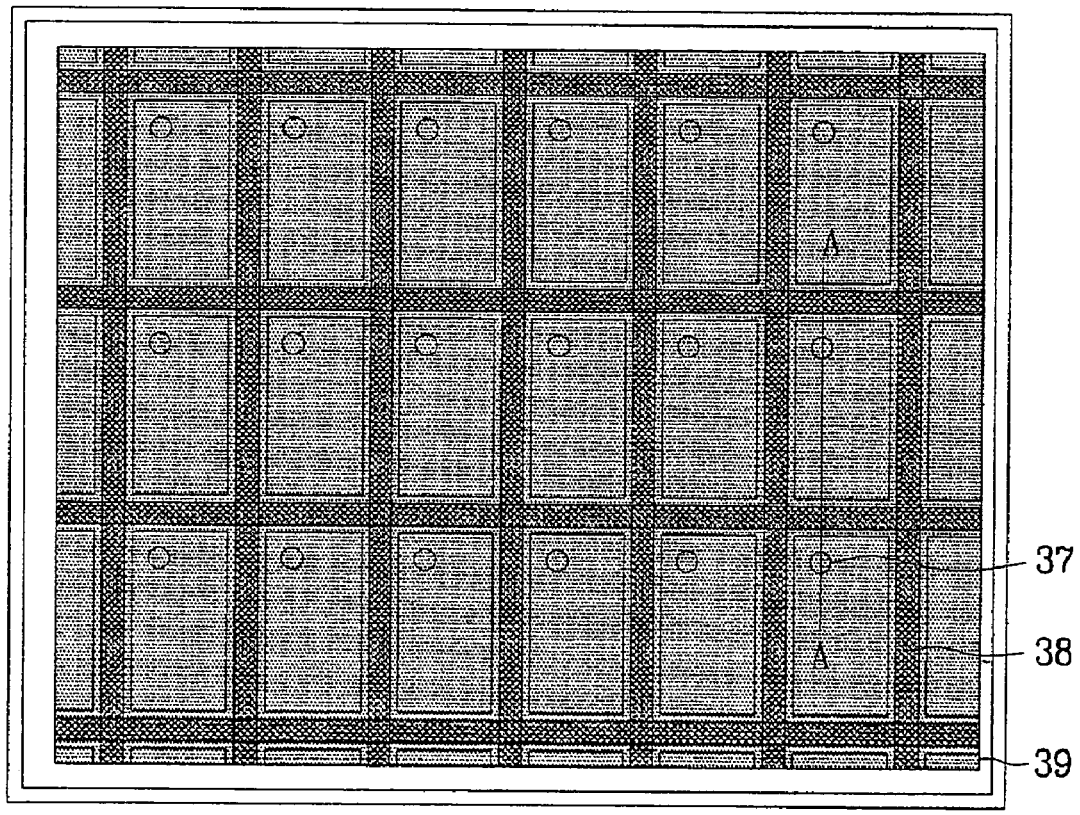
Figure 4D:
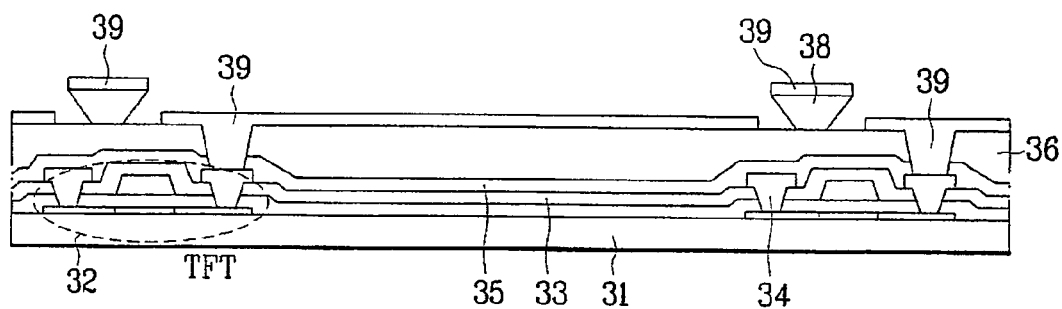

Next, as shown in FIGS. 3D and 4D, an anode electrode material 39 is deposited on the overall surface so as to allow the first contact hole 37 to be filled therewith.

As for the anode electrode material 39, a conductive material having good reflectance, in particular, metallic materials including Cr, Cu, W, Au, Ni, Al, AlNd, Ag, Ti, Ta, etc., alloys thereof or a lamination thereof can be used.

Since the partition wall 38 is formed at the portion which will divide the anode electrodes from each other, the anode electrodes 39 are automatically divided from each other when depositing the anode electrode material 39.

In other words, the anode electrode material 39 is formed on the partition wall 38 as well as the flattening insulation layer 36, at which the anode electrode material 39 on the partition wall 38 is automatically divided from the anode electrode material 39 on the flattening insulation layer 36, thereby allowing the anode electrodes 39 to be formed on the flattening insulation layer 36.

The anode electrode material 39 on the partition wall 38 may be formed to have a thickness in a range of about 500-2000 Å. Also, the anode electrode material 39 on the flattening insulating layer 36 may be formed to have a thickness in a range of about 500-2000 Å.

Figure 3E:
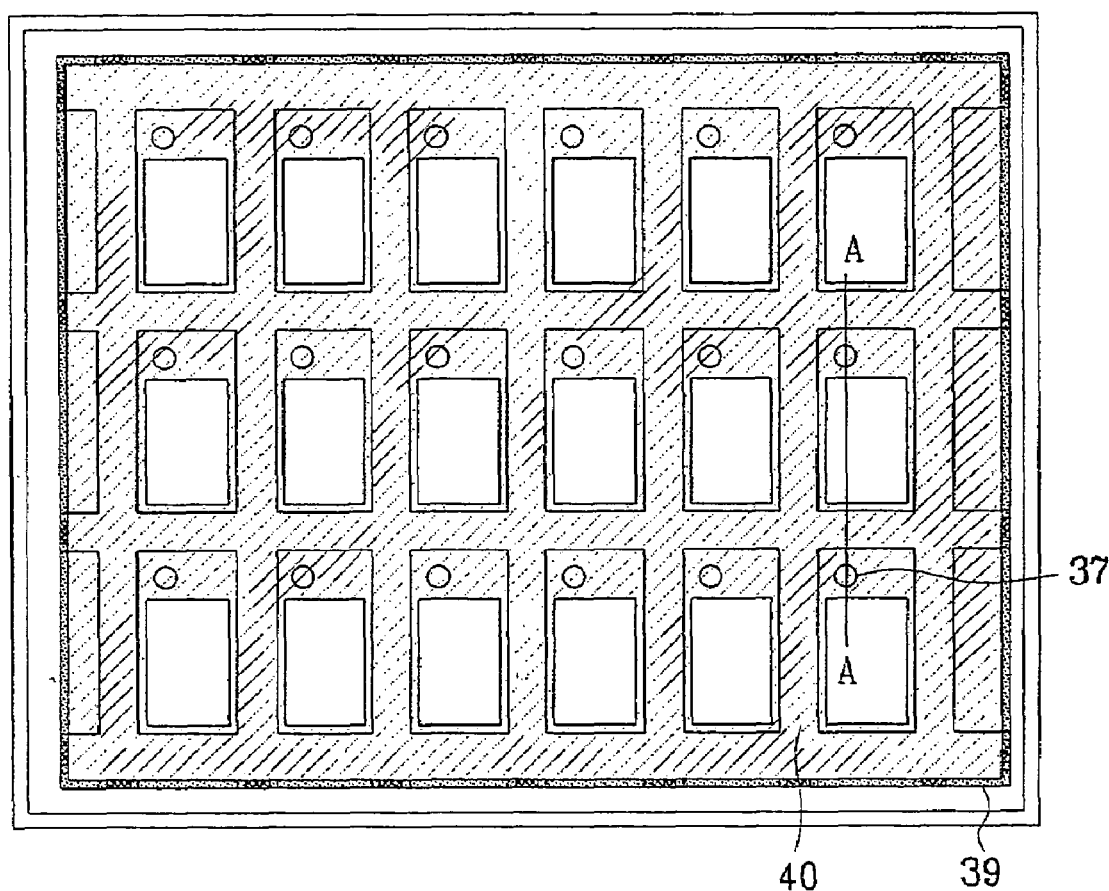
Figure 4E:
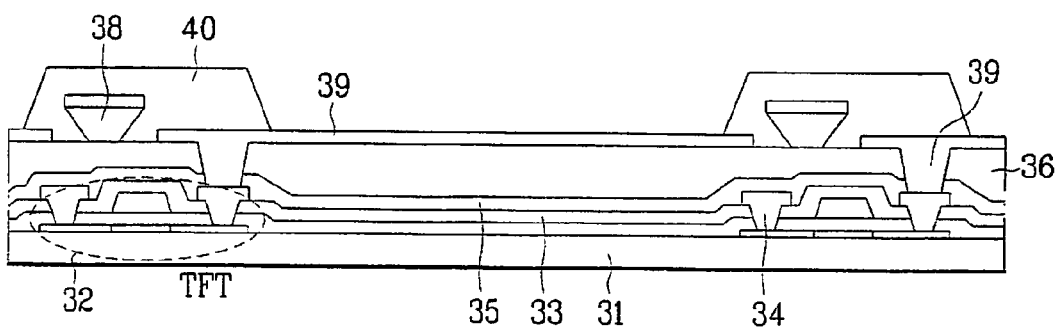

Next, as shown in FIGS. 3E and 4E, an insulation part 40 is formed on the overall surface other than a light emitting region (unit pixel region). At this time, the portion where the insulation part 40 is not formed will become a light emitting pixel.

As for the insulation part 40, an organic insulator or an inorganic insulator is used.

At this time, when the insulation part 40 comprises the organic insulator, the insulation part 40 preferably comprises $SiN_x$ or $SiO_x$, and when the insulation part 40 comprises the inorganic insulator, the insulation part 40 preferably comprises polyimide, poly-acryl, or novolac-based material.

Finally, an organic EL layer is formed on the overall surface including the insulation part 40, and a cathode electrode (second electrode) is formed on the organic EL layer, thereby completing the organic EL device of the present invention.

However, with the top-emission type organic EL device constructed as described above does, the problem of the prior art is not completely solved. The most important problem of the top-emission type organic EL device constructed as described above is in its structure.

In other words, since light advances upwardly towards each cathode electrodes, the cathode electrode must be transparent, and thus suffers from high resistance.

Thus, even though it is necessary to form a subsidiary electrode for each cathode electrode, a satisfactory method has not been yet developed due to weakness of the organic EL layer against moisture and oxygen.

According to the present invention, such a problem can be solved by constituting the anode electrode material formed on the partition wall so as to be used as a subsidiary electrode 39 when the anode electrode material 39 is deposited on the overall surface such that the first contact hole 37 is filled with the anode electrode material, as shown in FIGS. 3D and 4D.

Figure 6A:
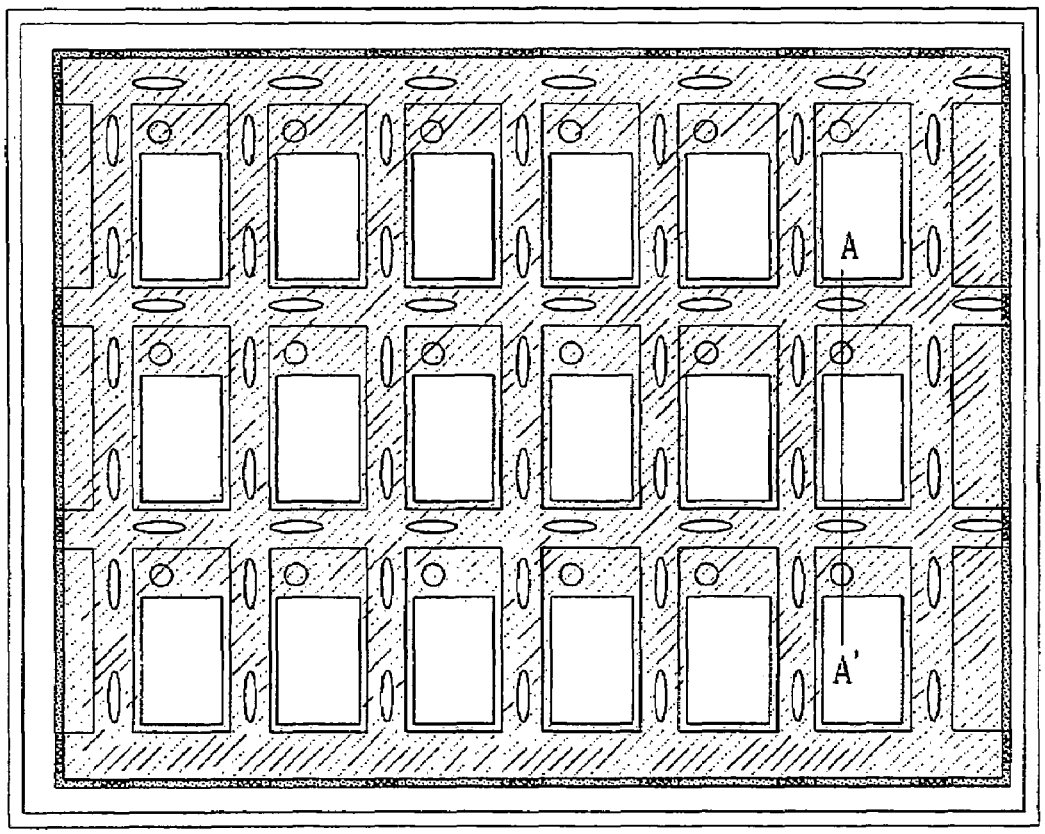
FIG. 6A is a plan view illustrating an organic EL device in accordance with another embodiment of the present invention.
Figure 6B:
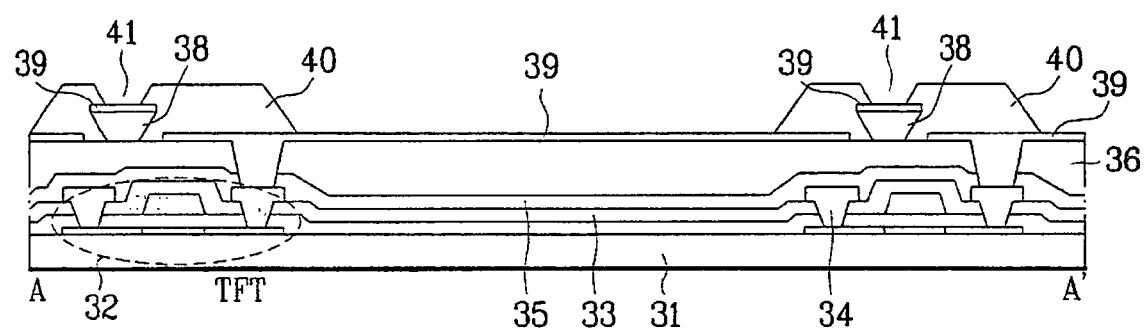
FIG. 6B is a cross-sectional view taken along line A-A shown in FIG. 6A.

To this end, when forming the insulation part 40 at the portion excluding the light emitting region, as shown in FIGS. 3E and 4E, a second contact hole 41 is formed on the insulation part 40 so as to expose the anode electrode material (subsidiary material 39) on the partition wall 38, as shown in FIGS. 6A and 6B.

At this time, the shape or the number of the second contact holes 41 is not important.

Figure 7A:
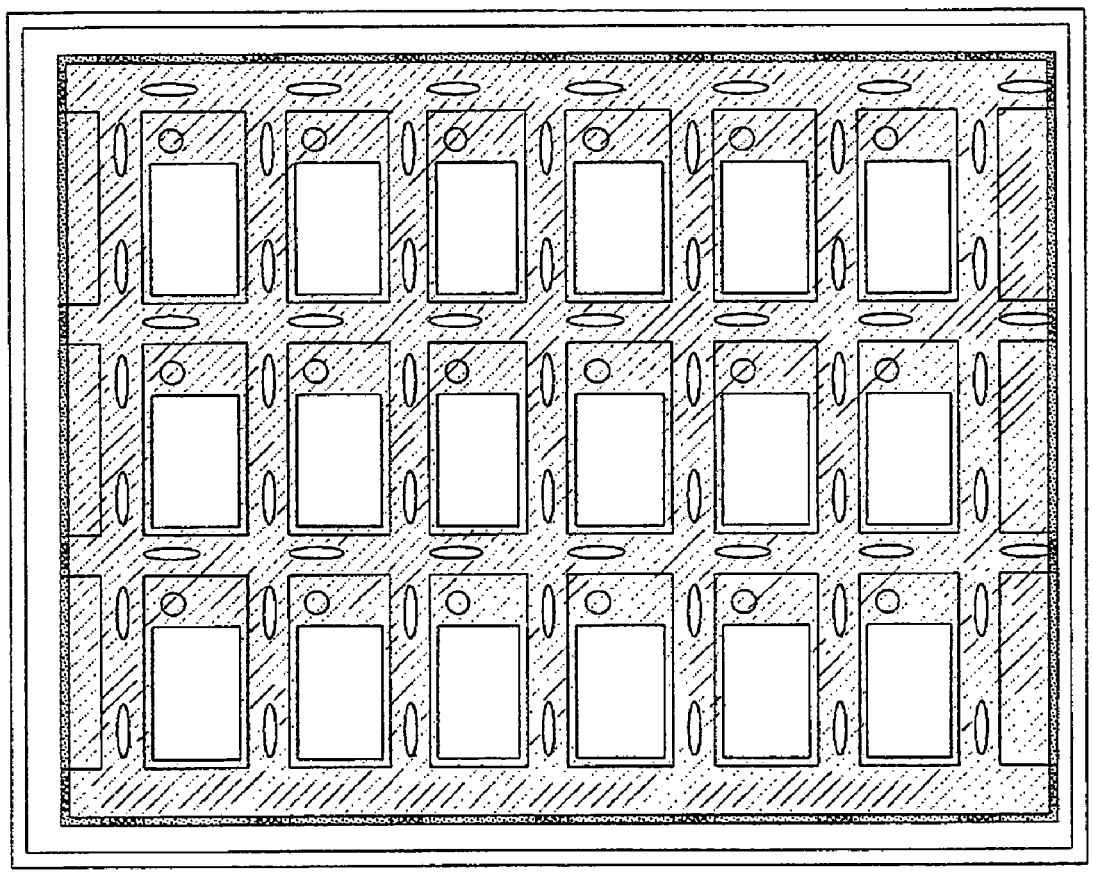
FIGS. 7A to 7F are plan views illustrating manufacturing steps of an organic EL device in accordance with another embodiment of the present invention.
Figure 7B:
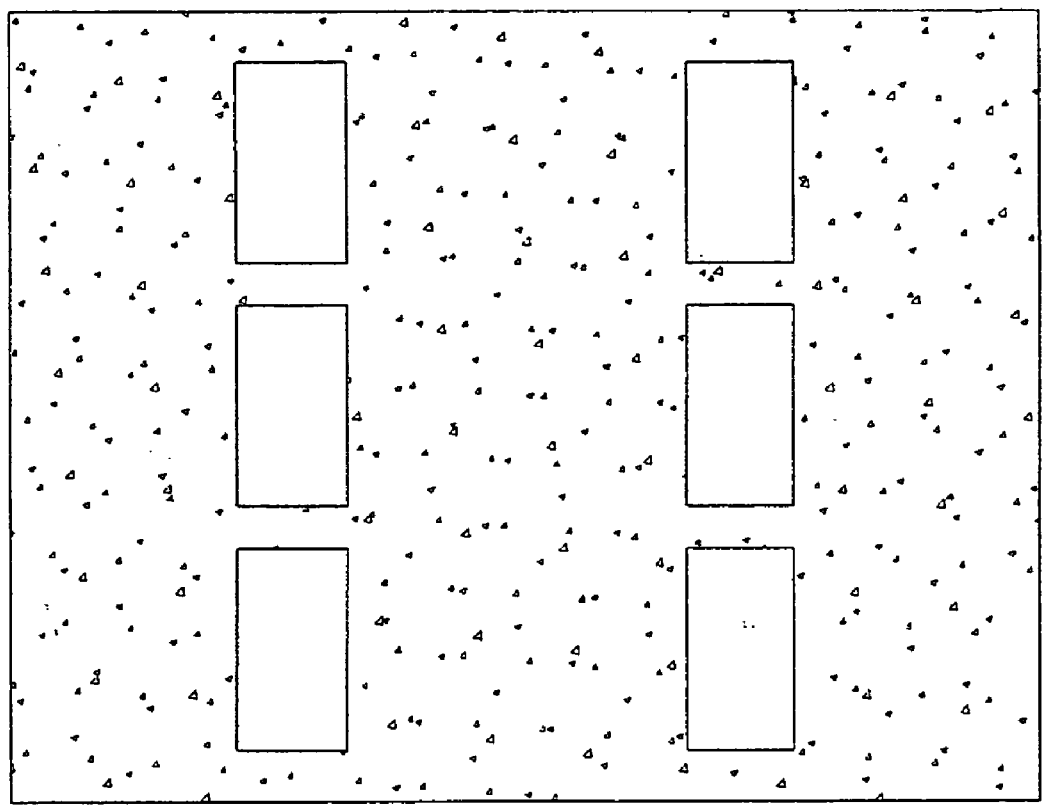
Figure 7C:
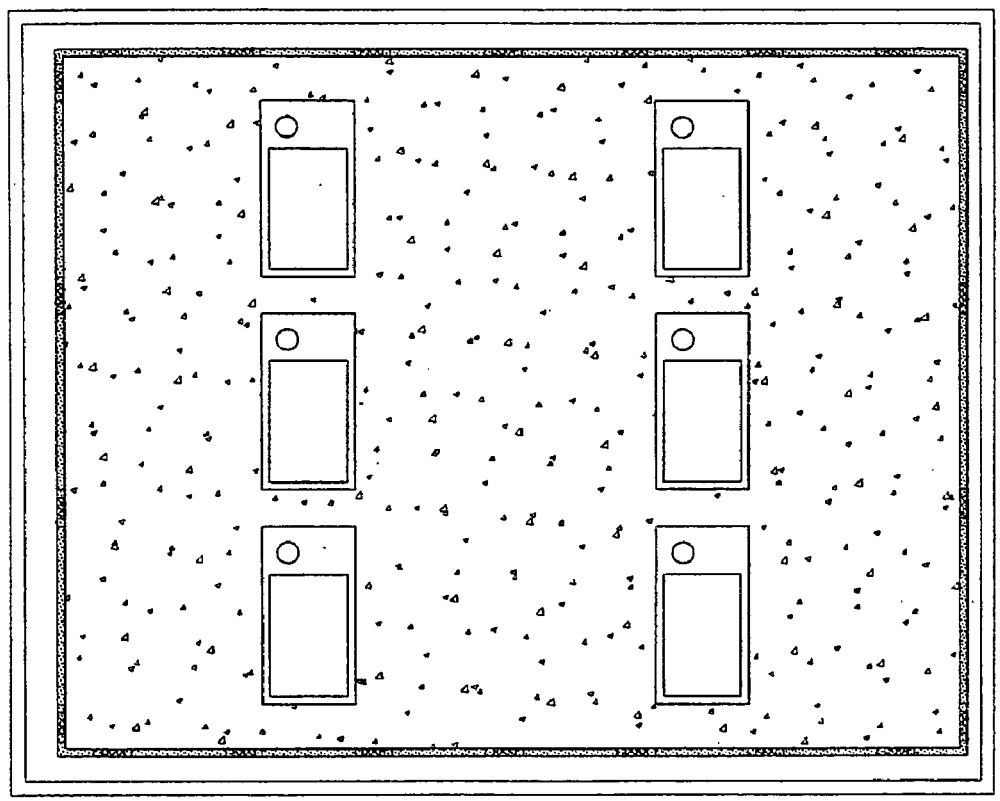
Figure 7D:
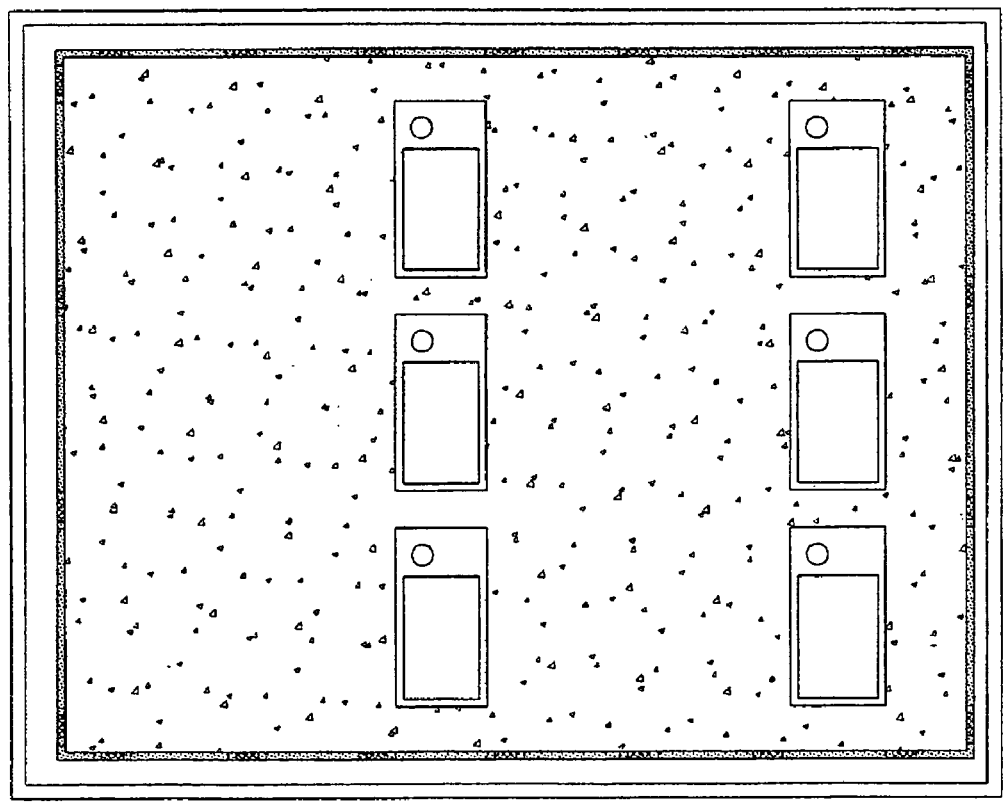
Figure 7E:
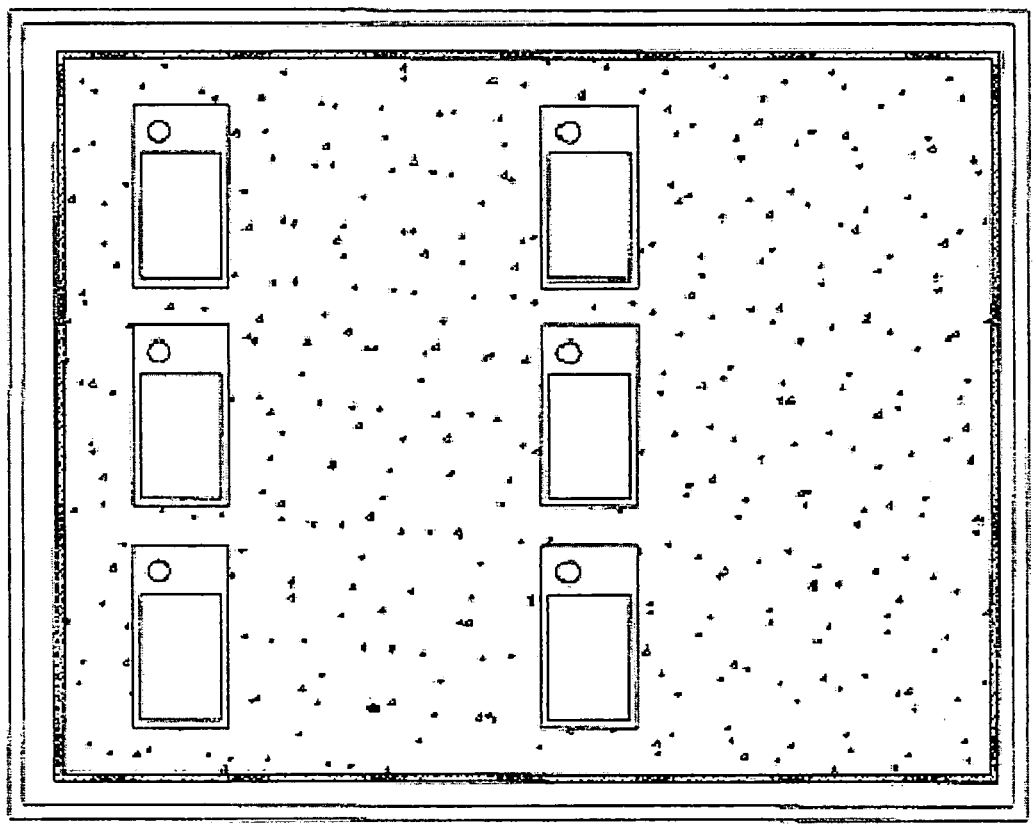

Then, an organic EL layer is formed on the substrate constructed as shown in FIG. 7A by depositing an organic layer on each of R, G and B pixels in the pixel regions for light emission using a shadow mask having openings corresponding to the pixel regions as shown in FIG. 7B while moving the shadow mask as shown in FIGS. 7C and 7E.

Figure 8:
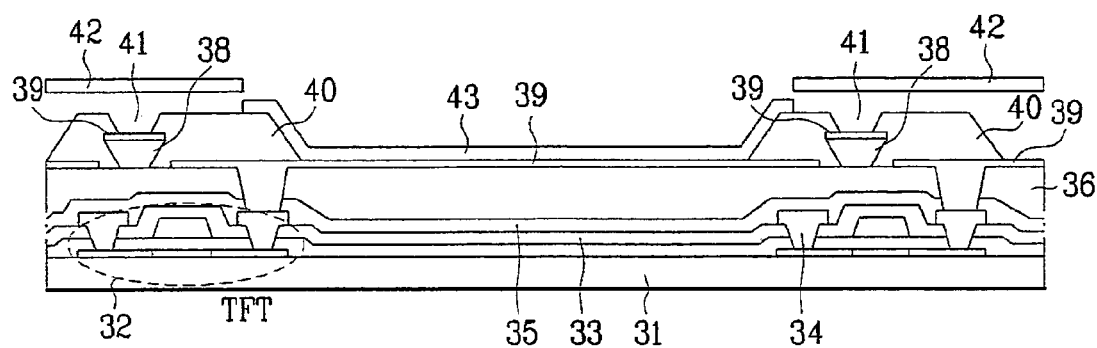
FIGS. 8 and 9 are cross-sectional views taken along line A-A' shown in FIGS. 7A to 7F.

At this time, as shown in FIG. 8, the shadow mask is structured such that the second contact holes 41 formed to expose the subsidiary electrodes 39 on the partition walls 38 are shielded by the shadow mask 42 when depositing the RGB organic layer 43 while allowing the openings of the shadow mask to correspond only to the pixel regions.

Figure 7F:
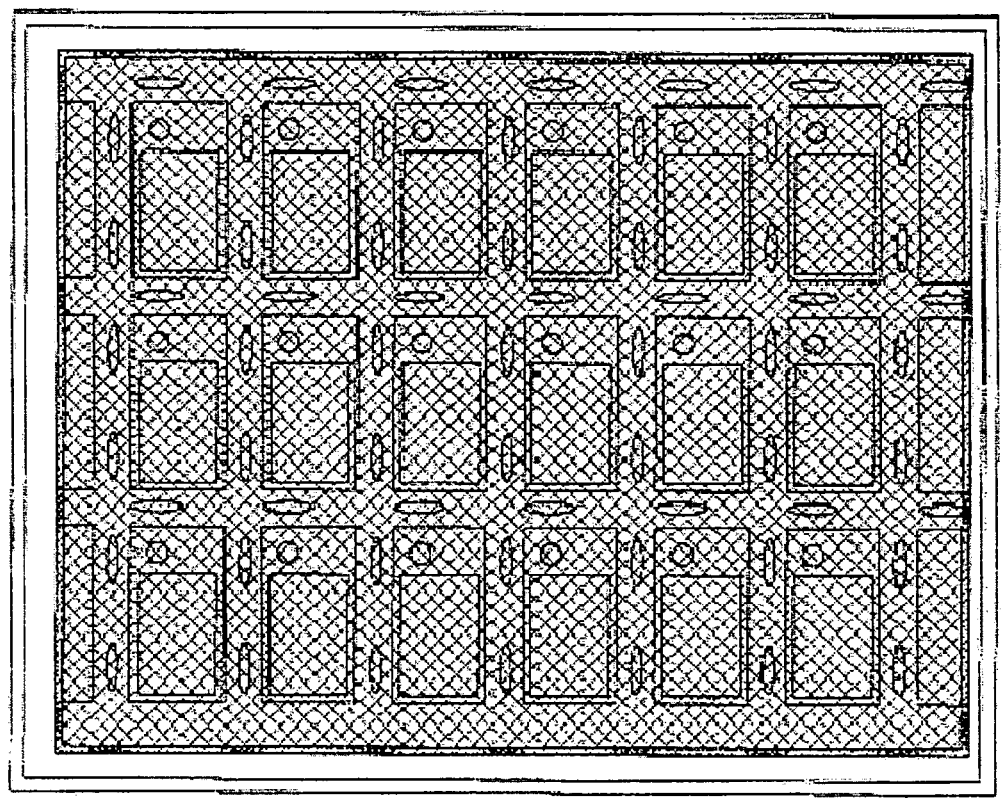

Finally, as shown in FIG. 7F, the cathode electrode 44 is formed on the overall surface including the organic EL layer and the second contact holes 41, thereby completing the organic EL device according to the present invention.

Figure 9:
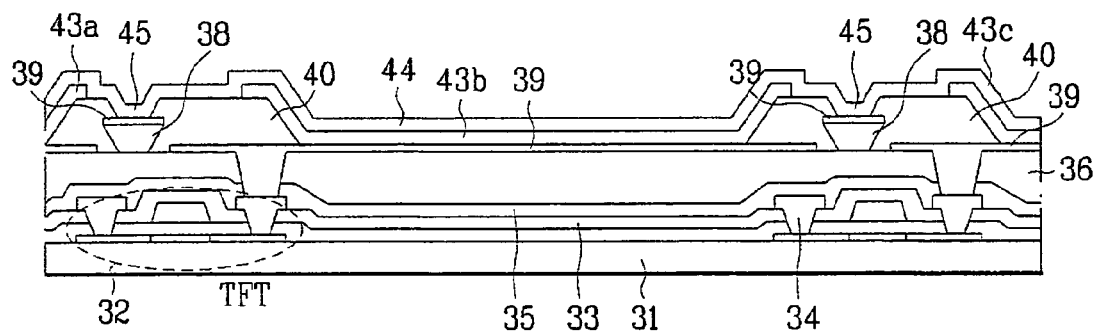

At this time, as shown in FIG. 9, RGB organic EL layers 43a, 43b and 43c are not formed on the anode electrode material 39 exposed through the second contact holes 41 on the partition wall 38. Instead, the cathode electrode 44 is directly deposited on the anode electrode material 39, and connected with a connection part 45 so that the anode electrode material 39 naturally serves as the subsidiary electrode 39 for the cathode electrode.

The cathode electrode 44 may be composed of a metal and ITO (indium tin oxide), or metal only. The thickness range of the ITO may be 500-2000 Å and the thickness range of the metal may be 50-250 Å. Accordingly, the entire thickness of the cathode electrode may be in a range of 50-2250 Å.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescent (EL) device, comprising:
    a substrate;
    TFTs located in respective unit pixel regions on the substrate;
    a first insulation layer to insulate the TFTs;
    first electrodes formed on the first insulation layer while contacting the TFTs, respectively;
    a partition wall positioned between the unit pixel regions on the first insulation layer;
    a subsidiary electrode formed on the partition wall;
    an organic light emitting layer positioned on the first electrodes;
    an insulation part to insulate each first electrode from an associated subsidiary electrode and;
    a second electrode positioned on the organic light emitting layer and connected with the subsidiary electrode,
    wherein the insulation part is formed on the partition wall and exposes the subsidiary electrode formed on the partition wall.

2. The organic EL device according to claim 1, further comprising: a
    contact connected with respective electrodes of each TFT through the first insulation layer.

3. The organic EL device according to claim 2, further comprising: a
    second insulation layer to insulate at least a portion of the contact.

4. The organic EL device according to claim 1, further comprising: a
    flattening insulation layer formed between the TFT and the first electrode to flatten each unit pixel region.

5. The organic EL device according to claim 1, wherein the first electrodes are separated from each other by the partition wall.

6. The organic EL device according to claim 1, wherein each of the first electrodes is a reflective electrode.

7. The organic EL device according to claim 1, wherein the second electrode is a transparent electrode.

8. The organic EL device according to claim 1, wherein the partition wall has an over-hang structure.

9. The organic EL device according to claim 1, wherein the partition wall has one shape selected from an inversed trapezoidal-shape, an eave shape, and a multiple-layer shape.

10. The organic EL device according to claim 1, wherein the partition wall comprises organic material, inorganic material, metal or combination thereof.

11. The organic EL device according to claim 1, wherein the subsidiary electrode is formed of the same material as that of the first electrodes.

12. The organic EL device according to claim 1, further comprising: a contact hole formed in the insulation part such that the subsidiary electrode is connected with the second electrode through the contact hole.

13. The organic EL device according to claim 1, wherein the thickness of the first electrode is in a range of 500-2000 Å.

14. The organic EL device according to claim 1, wherein the thickness of the second electrode or subsidiary electrode is in a range of 50-2250 Å.

15. An organic electroluminescent device, comprising:
    a substrate;
    TFTs located in respective unit pixel regions on the substrate;
    a first insulation layer to insulate the TFTs;
    first electrodes formed on the first insulation layer while contacting TFTs, respectively;
    a partition wall positioned between the respective unit pixel regions on the first insulation layer;
    a subsidiary electrode formed on the partition wall; an organic light emitting layer positioned above the first electrode;
    an insulation part to insulate the first electrode from the subsidiary electrode;
    a contact hole formed in the insulation part to expose the subsidiary electrode; and
    a second electrode positioned on the organic light emitting layer and connected with the subsidiary electrode through the contact hole.

* * * * *